US012648115B2

(12) United States Patent
Jia et al.

(10) Patent No.: US 12,648,115 B2
(45) Date of Patent: Jun. 2, 2026

(54) TWO-PHASE DOUBLE-LAYER STAGGERED ENHANCED MICROCHANNEL HEAT SINK

(71) Applicant: Beijing Jiaotong University, Beijing (CN)

(72) Inventors: Li Jia, Beijing (CN); Chuanchuan Cui, Beijing (CN); Zhikai Wang, Beijing (CN)

(73) Assignee: Beijing Jiaotong University, Beijing (CN)

( * ) Notice: Subject to any disclaimer, the term of this patent is extended or adjusted under 35 U.S.C. 154(b) by 0 days.

(21) Appl. No.: 19/409,757

(22) Filed: Dec. 5, 2025

(65) Prior Publication Data

US 2026/0089886 A1     Mar. 26, 2026

(30) Foreign Application Priority Data

Nov. 3, 2025   (CN) .......................... 202511597467.3

(51) Int. Cl.
*H05K 7/20*          (2006.01)

(52) U.S. Cl.
CPC ..... *H05K 7/20327* (2013.01); *H05K 7/20436* (2013.01)

(58) Field of Classification Search
CPC ....................... H05K 7/20436; H05K 7/20327
USPC ........................................................ 361/702
See application file for complete search history.

(56) References Cited

U.S. PATENT DOCUMENTS

| | | | | | |
|---|---|---|---|---|---|
| 6,457,515 | B1* | 10/2002 | Vafai | ..................... | H10W 40/47 257/E23.098 |
| 2003/0221813 | A1* | 12/2003 | Ritter | .................... | H10W 40/47 257/E23.098 |
| 2021/0247142 | A1* | 8/2021 | Duan | ........................ | F28D 1/03 |
| 2023/0207426 | A1* | 6/2023 | Yaglioglu | ............. | F28F 9/0278 257/714 |
| 2023/0284414 | A1* | 9/2023 | Kang | ........................ | F28F 3/12 165/80.4 |

FOREIGN PATENT DOCUMENTS

CN          119893954 A   *   4/2025   ......... H05K 7/20145

* cited by examiner

*Primary Examiner* — Zhengfu J Feng
(74) *Attorney, Agent, or Firm* — JCIPRNET

(57) ABSTRACT

A two-phase double-layer staggered enhanced microchannel heat sink, which includes a stacked upper cold plate and a lower cold plate. The upper cold plate is provided with a plurality of first fins arranged in an array and the lower cold plate is provided with a plurality of second fins arranged in an array, so as to form a first microchannel group in the upper cold plate and a second microchannel group in the lower cold plate. The first microchannel group and the second microchannel group are respectively configured to accommodate and guide a cooling working medium to flow through the upper cold plate and the lower cold plate; an extension direction of the first fins is perpendicular to an extension direction of the second fins, so that flow directions of the first microchannel group and the second microchannel group are vertically staggered.

11 Claims, 4 Drawing Sheets

TWO-PHASE DOUBLE-LAYER STAGGERED ENHANCED MICROCHANNEL HEAT SINK

CROSS-REFERENCE TO RELATED APPLICATION

The present application claims priority to Chinese Patent Application No. 202511597467.3, filed on Nov. 3, 2025, which is incorporated by reference in its entirety.

BACKGROUND

Technical Field

The present application relates to the field of electronic device heat dissipation technology and, in particular, to a two-phase double-layer staggered enhanced microchannel heat sink.

Description of Related Art

With the rapid development of electronic information technology towards high integration and high power density, the heat flux density of chips and other core heat generating components continues to rise, which has far exceeded the limits of traditional heat dissipation technologies such as air cooling and liquid cooling.

In the related art, microchannel heat sinks are used to solve the cooling of high heat flux density electronic devices. The microchannel heat sink is internally provided therein with densely arranged microchannels, and the cooling working medium undergoes forced convection in the microchannels to carry away heat, thereby achieving ultra-high performance heat dissipation.

However, the microchannel heat sinks in the related art have the following problems: the uneven distribution of the cooling working medium in the microchannels is prone to forming flow dead zones and local heat accumulation in specific areas, affecting heat dissipation performance; under high heat flux density conditions, the excessively high dryness of the two-phase working medium at the outlet of the channels is likely to cause dry-out phenomenon at the end of the microchannels, which seriously threatens the operational reliability and service life of electronic devices.

SUMMARY

Embodiments of the present application provide a two-phase double-layer staggered enhanced microchannel heat sink, which is used to solve the problems of low heat dissipation efficiency and easy occurrence of dry-out phenomenon of microchannel heat sinks in the prior art under high heat flux density conditions.

In a first aspect, embodiments of the present application provide a two-phase double-layer staggered enhanced microchannel heat sink, including: an upper cold plate; and a lower cold plate, wherein the lower cold plate is stacked and arranged at a bottom of the upper cold plate along a thickness direction thereof, and is connected to the upper cold plate to form an integral structure; the upper cold plate and the lower cold plate are respectively provided therein with a plurality of first fins arranged in an array and a plurality of second fins arranged in an array, so as to form a first microchannel group in the upper cold plate and a second microchannel group in the lower cold plate, and the first microchannel group and the second microchannel group are respectively configured to accommodate and guide a cooling working medium to flow through the upper cold plate and the lower cold plate; an extension direction of the first fins is perpendicular to an extension direction of the second fins, so that flow directions of the first microchannel group and the second microchannel group are vertically staggered; bottom walls of the first microchannel group and the second microchannel group along the thickness direction of the cold plates are further provided with porous layers.

The two-phase double-layer staggered enhanced microchannel heat sink provided by the embodiments of the present application has the following effects:

The embodiments of the present application improve heat dissipation performance through the design of double-layer cold plates, wherein the heat source is located below the lower cold plate, and its heat is mainly absorbed by the lower cold plate; the remaining part of the heat is conducted to the upper cold plate through the solid contact interface between the upper and lower cold plates, and the upper cold plate is configured to absorb the remaining part of the heat, thereby achieving the purpose of sharing heat and assisting the lower cold plate in completing heat dissipation. At the same time, the cooling working medium of the upper cold plate maintains a low temperature during the heat exchange process, forming a significant temperature gradient between the two cold plates, which further enhances the heat transfer from the lower cold plate to the upper cold plate. The cooling working medium in the lower cold plate is cooled by the cooling working medium in the upper cold plate, which reduces the dryness of the two-phase fluid in the lower cold plate, promotes the transfer of heat from the core area of the heat source to the two layers of microchannels, and improves the heat dissipation power.

The embodiments of the present application also optimize the microchannel layout of the upper and lower cold plates, so that the two layers of microchannels are vertically staggered to form a vertically staggered upper and lower flow field structure. The upper and lower flow field structures perform synergistic heat dissipation, optimize the distribution of flow field and temperature field, reduce local heat accumulation, and further improve heat dissipation efficiency.

The microchannels of the upper and lower cold plates respectively adopt an intermediate communication structure and an along-the-way gradually-expanding structure to realize fluid mixing and redistribution as well as an increase in flow cross-sectional area, thereby reducing flow instability and flow resistance.

At the same time, the embodiments of the present application also provide a porous layer on the bottom wall of the microchannels. Each cavity on the porous layer is a potential and efficient vaporization core, thereby increasing the vaporization core density, enhancing flow boiling heat transfer, advancing the boiling incipience point, reducing the wall temperature of the cold plate, improving the critical heat flux density, and significantly suppressing the risk of dry-out. It solves the problems of easy dry-out and low upper limit of heat flux density of traditional single-layer microchannels, and the heat dissipation capacity is increased by more than 100% under the same scale, which is especially suitable for long-term stable cooling of high heat flux density electronic devices.

BRIEF DESCRIPTION OF THE DRAWINGS

The accompanying drawings herein are incorporated into and constitute a part of this specification, illustrate embodiments consistent with the present application, and together with the specification, serve to explain the principles of the present application.

Figure 1:
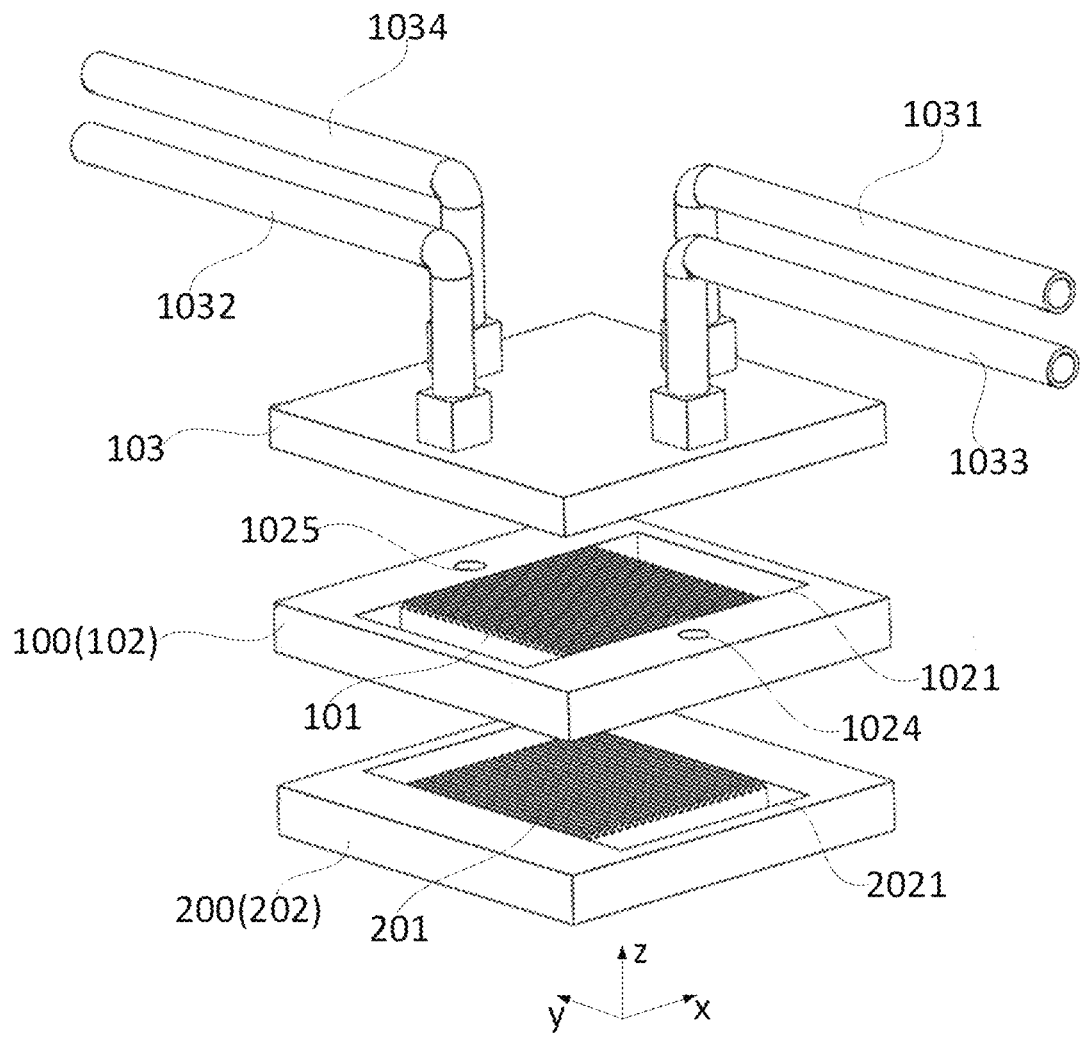

FIG. 1 is a first schematic structural diagram of a two-phase double-layer staggered enhanced microchannel heat sink provided by the present application.

Figure 2:
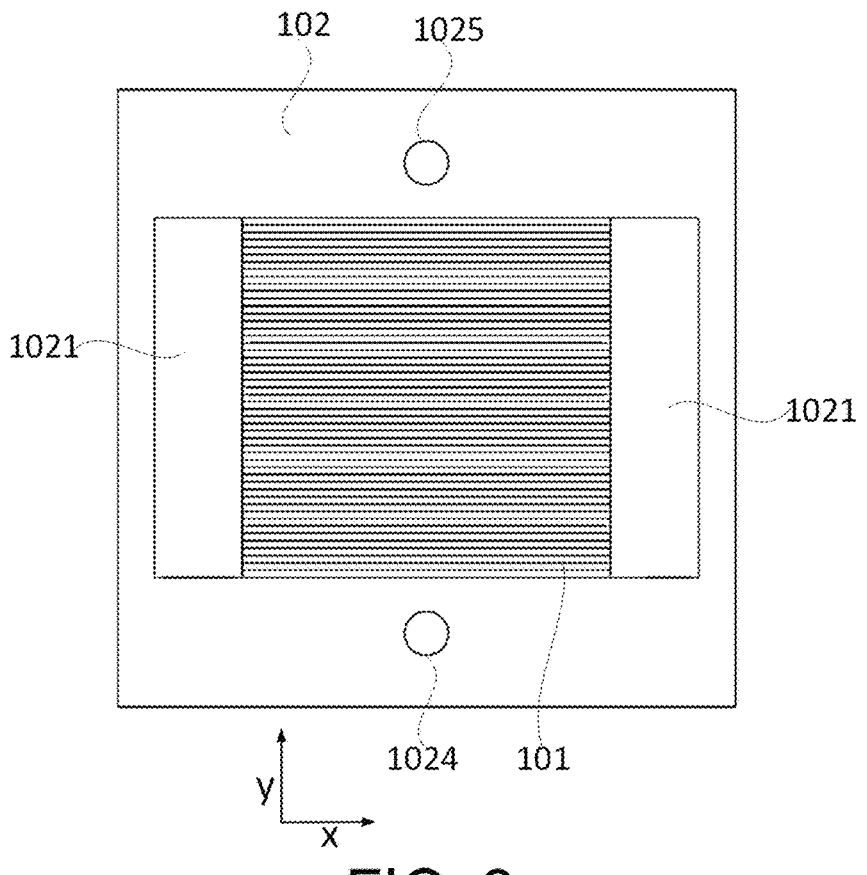

FIG. 2 is a first schematic structural diagram of an upper cold plate of a two-phase double-layer staggered enhanced microchannel heat sink provided by the present application.

Figure 3:
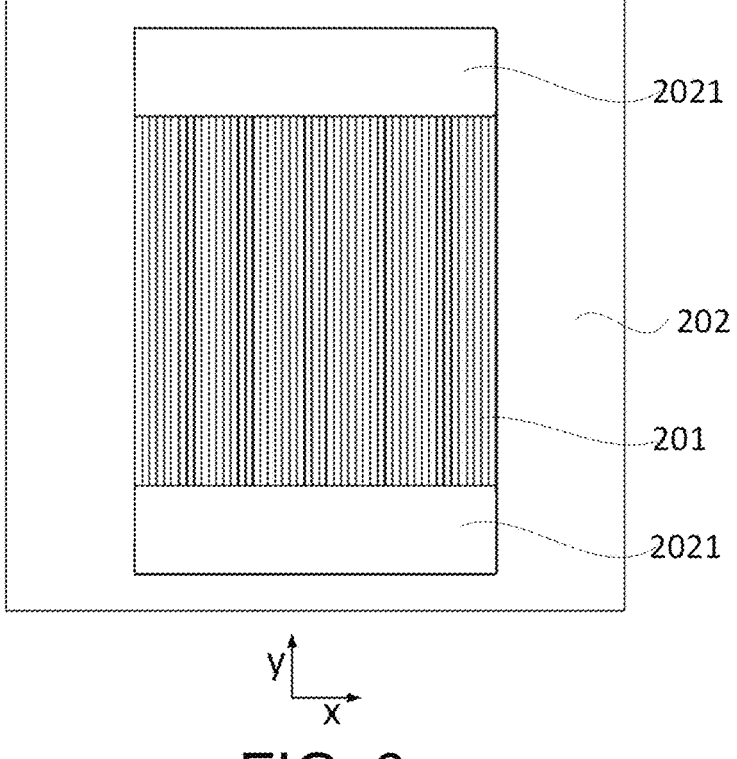

FIG. 3 is a schematic structural diagram of a lower cold plate of a two-phase double-layer staggered enhanced microchannel heat sink provided by the present application.

Figure 4:
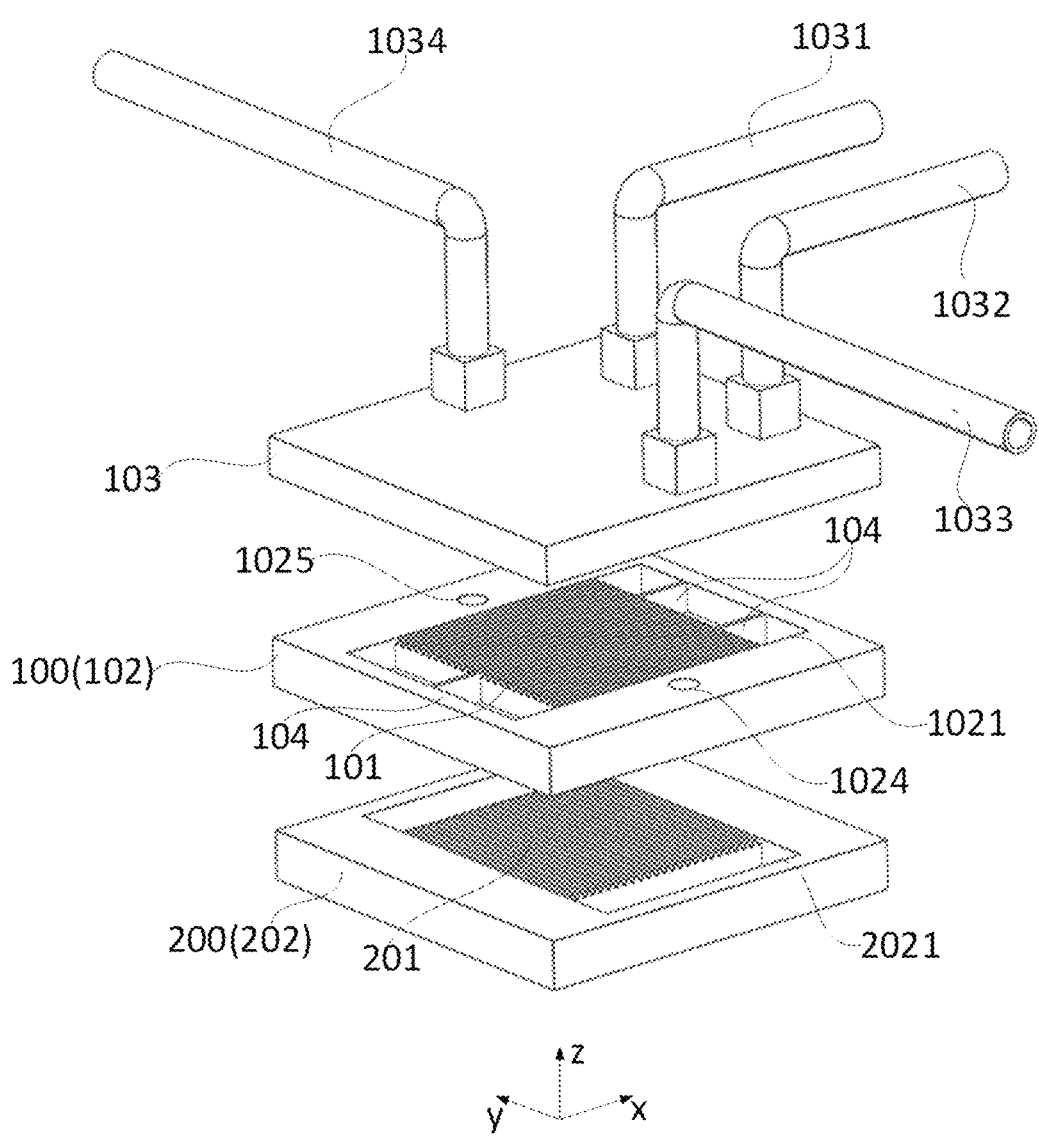

FIG. 4 is a second schematic structural diagram of a two-phase double-layer staggered enhanced microchannel heat sink provided by the present application.

Figure 5:
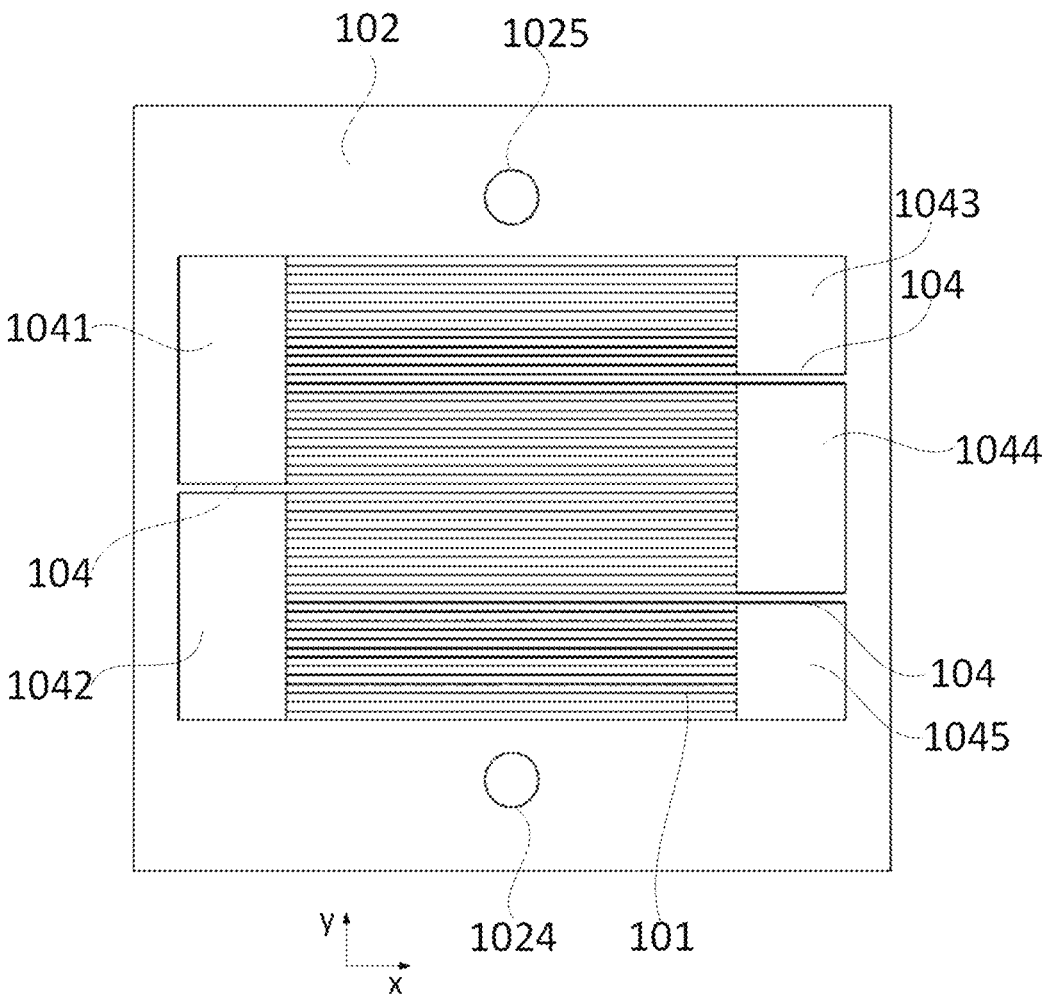

FIG. 5 is a second schematic structural diagram of an upper cold plate of a two-phase double-layer staggered enhanced microchannel heat sink provided by the present application.

Through the above accompanying drawings, the specific embodiments of the present application have been shown, and a more detailed description will be given hereinafter. These accompanying drawings and textual descriptions are not intended to limit the scope of the concept of the present application in any way, but to explain the concept of the present application to those skilled in the art by referring to specific embodiments.

DESCRIPTION OF THE EMBODIMENTS

Exemplary embodiments will be described in detail herein, and examples thereof are shown in the accompanying drawings. When the following description refers to the accompanying drawings, the same numerals in different drawings represent the same or similar elements unless otherwise indicated. The implementations described in the following exemplary embodiments do not represent all implementations consistent with the present application. On the contrary, they are merely examples of apparatuses and methods consistent with some aspects of the present application as detailed in the appended claims.

The technical solutions of the present application and how the technical solutions of the present application solve the above technical problems will be described in detail below with specific embodiments. The following specific embodiments may be combined with each other, and the same or similar concepts or processes may not be repeated in some embodiments. The embodiments of the present application will be described below with reference to the accompanying drawings.

First, the terms involved in the present application are explained:

Flow boiling heat transfer: a technology that utilizes the phase change (boiling) of liquid in forced flow to achieve extremely high heat dissipation efficiency, which has a higher heat transfer coefficient compared with single-phase liquid cooling.

Vaporization core density: the number of "nucleation sites" on the unit area of the heating wall that can effectively generate vapor bubbles during boiling heat transfer; the higher the vaporization core density, the more fully and uniformly the heat transfer of the entire heating surface is activated, and the overall heat transfer performance is also higher.

Boiling incipience point: an instantaneous state when stable generation of vapor bubbles first starts on the heating wall during boiling heat transfer; that is, the turning moment from "zero bubble" to "one bubble"; the boiling incipience point marks the transition of the heat transfer mode from single-phase liquid cooling with relatively low performance to nucleate boiling with extremely high performance.

Heat flux density: an amount of heat transferred per unit area per unit time.

Critical heat flux density: a critical heat load at which, when the heat flux density of the heating wall is high enough, the generation of bubbles is too fast and too many, resulting in the formation of a continuous vapor film on the wall, which causes a sharp drop in heat transfer capacity and a rapid rise in wall temperature. It represents the theoretical maximum heat dissipation capacity of a cooling system. Maximizing the critical heat flux density as much as possible can improve the heat dissipation upper limit and safety of the cooling system.

Dry-out (dry-up): a phenomenon in boiling heat transfer where the liquid is completely evaporated on the heating surface, causing the vapor to directly contact the heating surface, thereby sharply deteriorating heat transfer and causing a sudden rise in wall temperature, which is likely to cause overheating damage to the equipment.

Referring to FIGS. 1, 2 and 3, the two-phase double-layer staggered enhanced microchannel heat sink provided by the embodiment of the present application includes: an upper cold plate 100 and a lower cold plate 200.

The lower cold plate 200 is stacked and arranged at a bottom of the upper cold plate 100 along a thickness direction thereof (the z-axis shown in the figures), and is connected to the upper cold plate 100 through diffusion welding or brazing to form an integral structure. The connection is reliably sealed to prevent leakage of the cooling working medium.

Both the upper cold plate 100 and the lower cold plate 200 are made of materials with good thermal conductivity such as copper, aluminum, and diamond.

The upper cold plate 100 includes an upper base plate 102. Two upper liquid collecting grooves 1021 are provided on a top surface of the upper base plate 102 along a thickness direction thereof (the z-axis shown in the figures). The two upper liquid collecting grooves 1021 are spaced apart along a length direction of the cold plate (the x-axis shown in the figures). A plurality of first fins 101 arranged in an array are provided between the two upper liquid collecting grooves 1021 to form a first microchannel group in the upper cold plate 100, and the first microchannel group is configured to accommodate and guide the cooling working medium to flow through the upper cold plate 100.

Here the first microchannel group is in communication with both of the two upper liquid collecting grooves 1021.

The lower cold plate 200 includes a lower base plate 202. Two lower liquid collecting grooves 2021 are provided on a top surface of the lower base plate 202 along a thickness direction thereof (the z-axis shown in the figures). The two lower liquid collecting grooves 2021 are spaced apart along a width direction of the cold plate (the y-axis shown in the figures). A plurality of second fins 201 arranged in an array are provided between the two lower liquid collecting grooves 2021 to form a second microchannel group in the lower cold plate 200, and the second microchannel group is configured to accommodate and guide the cooling working medium to flow through the lower cold plate 200.

Here the second microchannel group is in communication with both of the two lower liquid collecting grooves 2021.

That is to say, the integral structure formed by connecting the upper cold plate 100 and the lower cold plate 200 has two layers of cooling flow channels.

The first fins 101 extend along the length direction of the cold plate (the x-axis shown in the figures), and the second fins 201 extend along the width direction of the cold plate (the y-axis shown in the figures). That is to say, the extension direction of the first fins 101 is perpendicular to the extension direction of the second fins 201, so that the flow directions of the first microchannel group and the second microchannel group are vertically staggered.

Porous layers are further provided on the bottom walls of the first microchannel group and the second microchannel group along the thickness direction of the cold plates (the z-axis shown in the figures).

The embodiments of the present application improve heat dissipation performance through the design of double-layer cold plates. The heat source is located below the lower cold plate 200, and the heat is mainly absorbed by the lower cold plate 200; the remaining part of the heat is conducted to the upper cold plate 100 through the solid contact interface between the upper and lower cold plates. The upper cold plate 100 is configured to absorb the remaining part of the heat, thereby achieving the purpose of sharing heat and assisting the lower cold plate 200 in completing heat dissipation. At the same time, the cooling working medium of the upper cold plate 100 maintains a low temperature during the heat exchange process, forming a significant temperature gradient between the two layers of cold plates, which further enhances the heat transfer from the lower cold plate 200 to the upper cold plate 100. The cooling working medium in the lower cold plate 200 is cooled by the cooling working medium in the upper cold plate 100, which reduces the dryness of the two-phase fluid in the lower cold plate 200, promotes the transfer of heat from the core area of the heat source to the two layers of microchannels, and improves the heat dissipation power.

Embodiments of the present application also optimize the microchannel layout of the upper and lower cold plates, such that the two layers of microchannels are vertically staggered to form a vertically staggered upper and lower flow field structure. The upper and lower flow field structures perform synergistic heat dissipation, optimize the distribution of the flow field and temperature field, reduce local heat accumulation, and further improve heat dissipation capacity.

Meanwhile, embodiments of the present application further provide a porous layer on a bottom wall of the microchannels. Each cavity on the porous layer is a potential and efficient vaporization core, thereby increasing the vaporization core density, enhancing flow boiling heat transfer, advancing the boiling incipience point, reducing the wall temperature of the cold plate, improving the critical heat flux density, and significantly suppressing the dry-out risk. It solves the problems of easy dry-out and low upper limit of heat flux density of traditional single-layer microchannels, and the heat dissipation capacity is increased by more than 100% under the same scale, which is especially suitable for long-term stable cooling of high heat flux density electronic devices.

In the embodiments of the present application, the cooling working medium may be a working medium with a low boiling point under an atmospheric pressure or a positive pressure, and the boiling point range of the cooling working medium is 20° C.-60° C.

In the embodiments of the present application, the first microchannel group has a serpentine flow channel structure.

A serpentine flow channel means that the first microchannel group is composed of a series of long, parallel straight channels, and adjacent straight channels are connected at their ends in sub-chambers, enabling the cooling working medium to flow repeatedly and turn along a single series-connected path within the first microchannel group.

Here, a flow channel inlet of the serpentine flow channel is close to a downstream of the cooling working medium flowing through the lower cold plate 200, and a flow channel outlet of the serpentine flow channel is close to an upstream of the cooling working medium flowing through the lower cold plate 200; the upper cold plate 100 changes the flow direction of the cooling working medium through the serpentine flow channel design, so that the cooling working medium in the upper cold plate 100 flows in from an outlet area of the lower cold plate 200 and directly cools a high-dryness area at the outlet of the lower cold plate 200, thereby effectively reducing the dryness of the two-phase fluid at the outlet of the lower cold plate 200, avoiding dry-out, and reducing flow instability.

Referring to FIGS. 4 and 5, in the embodiments of the present application, a closed upper liquid collecting groove 1021 is provided in the upper cold plate 100.

One upper liquid collecting groove 1021, the first microchannel group, and the other upper liquid collecting groove 1021 in the upper cold plate 100 are arranged and connected in sequence. At least one baffle 104 is provided in each of the two upper liquid collecting grooves 1021 to form sub-chambers, and the baffle 104 is configured to guide the cooling working medium flowing in the first microchannel group to flow along a serpentine path to form the serpentine flow channel.

Here, one baffle 104 is provided in one upper liquid collecting groove 1021, and the baffle 104 divides the upper liquid collecting groove 1021 into a first sub-chamber 1041 and a second sub-chamber 1042 adjacent along the width direction of the cold plate (the y-axis shown in the figures); two baffles 104 are provided in the other upper liquid collecting groove 1021, and the two baffles 104 divide the upper liquid collecting groove 1021 into a third sub-chamber 1043, a fourth sub-chamber 1044 and a fifth sub-chamber 1045 sequentially adjacent along the width direction of the cold plate (the y-axis shown in the figures).

The third sub-chamber 1043 is close to the downstream of the cooling working medium in the lower cold plate 200, and the fifth sub-chamber 1045 is close to the upstream of the cooling working medium in the lower cold plate 200; the flow channel inlet of the serpentine flow channel is located in the third sub-chamber 1043, and the flow channel outlet of the serpentine flow channel is located in the fifth sub-chamber 1045.

The cooling working medium flows in from the third sub-chamber 1043, flows into the first sub-chamber 1041 through the microchannels corresponding to the third sub-chamber 1043 and fills the first sub-chamber 1041, then flows into the fourth sub-chamber 1044 through the microchannels corresponding to the first sub-chamber 1041, continues to flow into the second sub-chamber 1042 through the microchannels corresponding to the fourth sub-chamber 1044 and fills the second sub-chamber 1042, and finally flows into the fifth sub-chamber 1045 through the microchannels corresponding to the second sub-chamber 1042.

By arranging the baffles 104 in the upper cold plate 100 and using the baffles 104 to guide the cooling working medium to flow along a serpentine path, the structure is simple and easy to implement; and those skilled in the art can increase the number of baffles 104, reduce the number of baffles 104, or adjust the arrangement position of the baffles 104 according to the actual heat dissipation scenario and the distribution of the first fins 101.

It should be noted that the upper base plate 102, the baffles 104 and the plurality of first fins 101 may be integrally formed.

Referring to FIGS. 4 and 5, in the embodiments of the present application, the upper cold plate 100 further includes: a cover plate 103.

The cover plate 103 is stacked and arranged on the top surface of the upper base plate 102 to enclose notches of the upper liquid collecting grooves 1021 and the microchannel group, forming closed flow channels in the upper cold plate 100.

The cover plate 103 may be hermetically connected to the upper base plate 102 through welding or detachable joints to ensure no leakage of the cooling working medium.

The cover plate 103 is provided with a first inlet pipeline 1031, a first outlet pipeline 1032, a second inlet pipeline 1033 and a second outlet pipeline 1034.

The first inlet pipeline 1031 is located above the third sub-chamber 1043 along the thickness direction of the cold plate (the z-axis shown in the figures), and the first inlet pipeline 1031 is connected with the third sub-chamber 1043; the first outlet pipeline 1032 is located above the fifth sub-chamber 1045 along the thickness direction of the cold plate (the z-axis shown in the figures), and the first outlet pipeline 1032 is connected with the fifth sub-chamber 1045; such that the first inlet pipeline 1031 and the first outlet pipeline 1032 are respectively connected with the first microchannel group, and the cooling working medium flows into the first microchannel group from the first inlet pipeline 1031 and flows out from the first outlet pipeline 1032 after completing heat exchange.

An inlet through hole 1024 and an outlet through hole 1025 are further provided on the upper base plate 102, and the inlet through hole 1024 and the outlet through hole 1025 are opposite along the width direction of the cold plate (the y-axis shown in the figures). One lower liquid collecting groove 2021, the second microchannel group, and the other lower liquid collecting groove 2021 in the lower cold plate 200 are arranged and connected in sequence. Two ports of the inlet through hole 1024 along an axial direction thereof are respectively connected with the second inlet pipeline 1033 and one lower liquid collecting groove 2021, and two ports of the outlet through hole 1025 along an axial direction thereof are respectively connected with the second outlet pipeline 1034 and the other lower liquid collecting groove 2021. The cooling working medium flows into the second microchannel group from the second inlet pipeline 1033 through the inlet through hole 1024, and flows out from the second outlet pipeline 1034 through the outlet through hole 1025 after completing heat exchange.

That is to say, two streams of low-boiling point cooling working medium are connected in parallel and flow into the upper cold plate 100 and the lower cold plate 200 respectively through separate pipelines; where, one stream of low-boiling point cooling working medium directly flows into the microchannels of the upper cold plate 100 through the inlet pipeline of the cover plate 103, and the other stream of low-boiling point cooling working medium enters the microchannels of the lower cold plate 200 sequentially through the inlet pipeline of the cover plate 103 and the inlet through hole 1024 of the upper cold plate 100. During the flow process, the low-boiling point cooling working medium exchanges heat with the cold plates to form two-phase fluid; finally, the two streams of two-phase fluid flow out from the upper cold plate 100 and the lower cold plate 200 respectively, and flow out through the outlet pipelines on the cover plate 103 to complete the cooling process.

It should be noted that an inlet area of the upper cold plate 100 corresponds to the outlet area of the lower cold plate 200, and an outlet area of the upper cold plate 100 corresponds to the inlet area of the lower cold plate 200, forming a combination of cross flow and countercurrent flow, which reduces the outlet dryness of the lower cold plate 200.

Meanwhile, the cooling working medium of the lower cold plate 200 is introduced in and led out through the inlet and outlet through holes opened on the upper cold plate 100, resulting in a highly integrated overall structure.

The series connection scenario in the embodiments of the present application is as follows:

The first outlet pipeline 1032 is connected with the second inlet pipeline 1033, and the low-boiling point cooling working medium flowing out of the upper cold plate 100 continues to enter the lower cold plate 200 through the second inlet pipeline 1033, completing the series-connection cooling heat exchange of the two cold plates. The low-boiling point cooling working medium first enters the upper cold plate 100 for subcooled boiling heat exchange, and then enters the lower cold plate 200 for saturated boiling heat exchange.

In the embodiments of the present application, the porous layer is formed by sintering and solidifying copper powder particles with a particle size of 50 μm-150 μm or copper wire mesh with a mesh number of 150 meshes-300 meshes.

A preparation process of the porous layer is as follows.

First, copper powder particles with a particle size of 50 μm-150 μm or copper wire mesh with 150 meshe-300 meshes are placed in a concave mold and sintered and solidified at 850° C. to form a structure with the same size as the first microchannel group and the second microchannel group; then, the solidified porous layer is placed on the bottom walls of the first microchannel group and the second microchannel group, pressed with a convex mold, and then sintered in a diffusion welding furnace or sintering furnace at 850° C. for 90 minutes, so that the porous layer is completely fixed on the bottom walls of the first microchannel group and the second microchannel group to achieve tight bonding and ensure heat transfer performance.

Copper has excellent thermal conductivity. When copper powder particles with a particle size of 50 μm-150 μm are used, the sintered porous layer has the optimal capillary force, which can ensure that the liquid flows smoothly inside the porous layer and that the generated vapor bubbles can easily detach and escape.

When copper wire mesh with 150 meshes-300 meshes is used, a sintered body can not only generate sufficient capillary force to ensure continuous and stable supply of liquid to the evaporation interface, but also has sufficient permeability to allow efficient escape of vapor bubbles.

Here, a thickness of the porous layer formed by sintering and solidifying copper powder particles or copper wire mesh may be 0.3 mm-0.8 mm. This ensures that the porous layer has strong and timely capillary pumping capacity to suppress dry-out.

In the embodiments of the present application, the porous layer may also be composed of a plurality of micro fins arranged in an array, and a height of the micro fins along the thickness direction of the cold plate is 0.1 mm-0.14 mm. This ensures that the porous layer has strong and timely capillary pumping capacity to suppress dry-out.

In the embodiments of the present application, a porosity of the porous layer is 40%-60%.

The porosity refers to a percentage of the pore volume inside the porous material to a total volume of the material.

The porous layer within the above porosity range has excellent capillary force. During boiling, the strong capillary force can continuously and autonomously deliver the liquid working medium in the main channel to the wall area that needs urgent supplement due to violent evaporation, achieving a good liquid supplement effect and improving heat flux density.

Here, the porous layer has a uniform pore size distribution to greatly increase the vaporization cores, enabling the working medium with a low boiling point under an atmospheric pressure or the working medium with a low boiling point under a positive pressure of the cold plate to boil in advance.

In the embodiments of the present application, the porosity of the porous layer increases in a direction pointing to a heat source to be cooled.

A high-porosity area is close to the heat source side, providing a large number of vaporization cores, ensuring that the boiling incipience point is advanced, and greatly enhancing the phase change heat transfer process; a low-porosity area is close to the outlet side, and the finer and denser pore network has greater capillary pressure, which can continuously "pull" the liquid in the main channel to the high-porosity area where violent evaporation is occurring, ensuring efficient liquid replenishment to the high-dryness area and preventing it from being dried out.

In the embodiments of the present application, cross-sections of the first fins 101 and the second fins 201 are rectangular cross-sections. That is to say, both the first microchannel group and the second microchannel group are composed of a series of parallel straight channels, which facilitates processing and ensures uniform heat dissipation of the cooling working medium.

In the embodiments of the present application, a projection of the first microchannel group in the thickness direction of the cold plate (the z-axis shown in the figures) coincides with a projection of the second microchannel group in the thickness direction of the cold plate (the z-axis shown in the figures).

The shape, structure and size of the first microchannel group are the same as those of the second microchannel group, and the first microchannel group is directly opposite to the second microchannel group in the thickness direction of the cold plate (the z-axis shown in the figures). Both have the same projected heat exchange area, ensuring that the upper cold plate 100 can assist the lower cold plate 200 in heat dissipation.

In the embodiments of the present application, thicknesses of the first fins 101 and the second fins 201 are first thicknesses; a distance between two adjacent first fins 101 and a distance between two adjacent second fins 201 are first distances; heights of the first fins 101 and the second fins 201 along the thickness direction of the cold plates are first heights; where the first thicknesses are the same, the first distances are the same and the first heights are the same, and each of the first thicknesses, the first distances and the first heights is 1 mm-2 mm.

In the embodiments of the present application, the first thicknesses, the first distances and the first heights may also be different, and those skilled in the art can set them according to actual application scenarios.

In the embodiments of the present application, one of side walls of the outlet flow channels of the first microchannel group and the second microchannel group is provided with a step. A height of the step in the thickness direction of the cold plates (the z-axis shown in the figures) gradually decreases along a flow direction of the cooling working medium, so that the outlet flow channel gradually expands along the flow direction of the cooling working medium.

The gradual expansion of the outlet flow channel along the flow direction of the cooling working medium provides sufficient diffusion space for the cooling working medium in the outlet area, effectively reduces the pressure drop and flow resistance of the gas-liquid mixed flow at the outlet, and improves flow stability.

The two-phase double-layer staggered enhanced microchannel heat sink of the embodiments of the present application will be described in detail below through specific embodiments.

The microchannel heat sink is composed of a cover plate 103, an upper cold plate 100 and a lower cold plate 200. The cover plate 103, the upper cold plate 100 and the lower cold plate 200 are made of red copper material, and form a complete closed structure through precision diffusion welding.

In this embodiment, vacuum diffusion welding technology is used to complete the connection of each layer. The welding surfaces of the cover plate 103, the upper cold plate 100 and the lower cold plate 200 are ground by a grinding wheel, the surface roughness is controlled within Ra1.6 μm, the surface oxide layer and impurities are removed, the overall deviation does not exceed 1%, the welding temperature is controlled at 850° C., and the vacuum degree is maintained below $5 \times 10^{-3}$ Pa.

A thickness of the cover plate 103 is 6 mm, and a thickness of each of the upper cold plate 100 and the lower cold plate 200 is 10 mm; surfaces of the cover plate 103, the upper cold plate 100 and the lower cold plate 200 are all subjected to precision milling to ensure sufficient flatness for welding tightness.

Diameters of the first inlet pipeline 1031, the first outlet pipeline 1032, the second inlet pipeline 1033 and the second outlet pipeline 1034 are 8 mm, which are welded on the cover plate 103 to realize the inlet and outlet circulation of the cooling working medium.

The first microchannel group of the upper cold plate 100 and the second microchannel group of the lower cold plate 200 are effective heat dissipation areas. A distribution area of the first microchannel group of the upper cold plate 100 and the distribution area of the second microchannel group of the lower cold plate 200 are both 32 mm×50 mm, and the first microchannel group is aligned with the second microchannel group.

Cross-sectional dimensions of the first fins 101 composing the first microchannel group and the second fins 201 composing the second microchannel group are both 1 mm in width and 1.5 mm in height; a length of the first microchannel group of the upper cold plate 100 along the length direction of the cold plate (the x-axis shown in the figures) is 50 mm, with a total of 16 first fins 101; a width of the second microchannel group of the lower cold plate 200 along the width direction of the cold plate (the y-axis shown in the figures) is 32 mm, with a total of 25 second fins 201, forming a vertically staggered flow field structure.

Porous layers sintered from copper powder are provided on the bottom walls of the first microchannel group and the second microchannel group along the thickness direction of the cold plates (the z-axis shown in the figures); where, red copper powder with a particle size of 50 μm is sintered at 850° C., with a thickness of 0.5 mm and a porosity of 60%, which is combined with the bottom walls of the first microchannel group and the second microchannel group through diffusion welding.

A working process of the microchannel heat sink is as follows.

Two streams of low-boiling point cooling working medium are separately controlled in flow rate through the parallel system by the first inlet pipeline 1031, the first outlet pipeline 1032, the second inlet pipeline 1033 and the second outlet pipeline 1034. After the two streams of low-boiling point cooling working medium enter from the first inlet pipeline 1031 and the second inlet pipeline 1033 respectively, one stream directly flows into the first microchannel group of the upper cold plate 100, flows along the length direction, and flows out after heat exchange; the other stream enters the second microchannel group of the lower cold plate 200 through the inlet through hole 1024 (with a diameter of 8 mm and a bottom plate liquid collecting groove width of 10 mm) of the upper cold plate 100, flows along the width direction, and flows out through the outlet through hole 1025 after heat exchange.

During the flow in the two layers of cold plates, on the one hand, the low-boiling point cooling working medium undergoes forced convection boiling heat exchange with the cold plates, and the copper powder sintered porous layer at the bottom of the microchannels provides a large number of vaporization cores, prompting the working medium to start boiling at a lower wall temperature; on the other hand, the capillary force of the porous layer continuously supplements liquid to the vaporization cores, preventing the risk of dry-out caused by increased dryness. At the same time, the upper cold plate 100 assists the lower cold plate 200 in completing the heat exchange process. Finally, the low-boiling point two-phase working medium flows out from the upper cold plate 100 and the lower cold plate 200 respectively, completing the cooling process.

Specifically, the heat source is located below the lower cold plate 200, and its heat is mainly absorbed by the lower cold plate 200. Part of the heat may be conducted to the upper cold plate 100 through the solid contact interface between the two layers of cold plates, and the low-boiling point working medium flowing in the upper cold plate 100 may timely conduct this part of the heat out, directly sharing the heat load of the lower cold plate 200; at the same time, the low-boiling point working medium of the upper cold plate 100 maintains a low temperature during the heat exchange process, forming a significant temperature gradient between the two layers of cold plates, which further enhances the heat transfer from the lower cold plate 200 to the upper layer. The low-boiling point working medium in the lower cold plate 200 is cooled by the low-boiling point working medium of the upper cold plate 100, which reduces the dryness of the two-phase fluid in the lower cold plate 200, promotes the transfer of heat from the core area of the heat source to the two layers of microchannels, and improves the heat dissipation power.

Finally, the staggered microchannels of the two layers of cold plates change the distribution form of the flow field and temperature field, effectively reducing the local heat flux concentration of the lower cold plate 200, forming a synergistic heat dissipation effect with the flow of the working medium, and ultimately achieving efficient assistance in the heat exchange of the lower cold plate 200.

Performance tests show that the two-phase double-layer staggered enhanced microchannel heat sink exhibits excellent heat dissipation performance under test conditions such as using working medium fluid with a low boiling point under an atmospheric pressure and high-pressure refrigerant: when the effective heat dissipation area is 32 mm×50 mm, the heating power when dry-out occurs is more than 2400 W and 3000 W respectively, and the critical heat flux density reaches more than 200 $W/cm^2$ and 260 $W/cm^2$ respectively, which is an increase of more than 100% compared with the traditional single-layer microchannel structure; when the heat flux density is 50~200 $W/cm^2$, compared with the traditional single-layer microchannel structure, the double-layer staggered microchannel structure reduces the wall temperature by 5-10° C. at maximum; under exactly the same working conditions, compared with the traditional single-layer microchannel structure, the double-layer staggered microchannel structure greatly improves flow instability and reduces temperature fluctuation by at least 40%.

This embodiment is suitable for cooling high heat flux density electronic devices, and particularly suitable for cooling scenarios of high heat flux density chips (such as 1000 W-2600 W level GPUs, etc.). In practical applications, precise matching of heat loads in different regions can be achieved by adjusting the flow distribution ratio of the first inlet pipeline 1031, the first outlet pipeline 1032, the second inlet pipeline 1033 and the second outlet pipeline 1034.

Test data shows that when the local heat flux density of the chip suddenly increases to 260 $W/cm^2$, the system can still maintain stable operation without dry-out phenomenon.

It should be noted that although the embodiments of the present application are applied to the heat dissipation scenario of high-power chips, the technical solution of the embodiments of the present application is also applicable to the heat dissipation needs of other high-power electronic devices, such as power Metal-Oxide-Semiconductor Field-Effect Transistor (MOSFETs), Central Processing Unit (CPUs), Graphics Processing Unit (GPUs), etc. Any modified application based on the basic design idea of the present embodiments, as long as it adopts the core technical features of the present application, shall fall within the protection scope of the present patent.

Finally, it should be noted that: after considering the specification and practicing the application disclosed herein, those skilled in the art will easily think of other embodiments of the present application. The present application is intended to cover any modifications, uses or adaptive changes of the present application. These modifications, uses or adaptive changes follow the general principles of the present application and include common knowledge or conventional technical means in the technical field not disclosed by the present application, and are not limited to the precise structure already described above and shown in the accompanying drawings, and various modifications and changes can be made without departing from its scope. The scope of the present application is only limited by the appended claims.

What is claimed is:

1. A two-phase double-layer staggered enhanced microchannel heat sink, comprising:
   an upper cold plate; and
   a lower cold plate, wherein the lower cold plate is stacked and arranged at a bottom of the upper cold plate along a thickness direction thereof, and is connected to the upper cold plate to form an integral structure;
   the upper cold plate and the lower cold plate are respectively provided therein with a plurality of first fins arranged in an array and a plurality of second fins arranged in an array, so as to form a first microchannel group in the upper cold plate and a second microchannel group in the lower cold plate, and the first microchannel group and the second microchannel group are respectively configured to accommodate and guide a cooling working medium to flow through the upper cold plate and the lower cold plate;

an extension direction of the first fins is perpendicular to an extension direction of the second fins, so that flow directions of the first microchannel group and the second microchannel group are vertically staggered;

bottom walls of the first microchannel group and the second microchannel group along the thickness direction of the cold plates are further provided with porous layers;

wherein the first microchannel group of the upper cold plate is a serpentine flow channel, a flow channel inlet of the serpentine flow channel is close to a downstream of the cooling working medium flowing through the lower cold plate, and a flow channel outlet of the serpentine flow channel is close to an upstream of the cooling working medium flowing through the lower cold plate;

wherein two upper liquid collecting grooves are provided in the upper cold plate;

the plurality of first fins are arranged between the two upper liquid collecting grooves, and two ends of the plurality of first fins along the extension direction thereof extend toward the two upper liquid collecting grooves, respectively;

at least one baffle is respectively provided in each of the two upper liquid collecting grooves, and the at least one baffle is configured to guide the cooling working medium flowing in the upper cold plate to flow along a serpentine path, so as to form the serpentine flow channel.

2. The two-phase double-layer staggered enhanced microchannel heat sink according to claim 1, wherein the upper cold plate comprises:

an upper base plate, wherein the two upper liquid collecting grooves are provided on a top surface of the upper base plate along the thickness direction of the cold plate;

a cover plate, wherein the cover plate is stacked and arranged on the top surface of the upper base plate to enclose the two upper liquid collecting grooves;

the cover plate is provided with a first inlet pipeline, a first outlet pipeline, a second inlet pipeline and a second outlet pipeline, and the first inlet pipeline and the first outlet pipeline are respectively connected with the two upper liquid collecting grooves to allow one stream of the cooling working medium to flow through the first microchannel group;

two lower liquid collecting grooves are provided in the lower cold plate, the plurality of second fins are arranged between the two lower liquid collecting grooves, and two ends of the plurality of second fins along the extension direction thereof extend toward the two lower liquid collecting grooves, respectively;

the upper base plate is provided with an inlet through hole and an outlet through hole, two ports of the inlet through hole along an axial direction thereof are respectively connected with the second inlet pipeline and one of the lower liquid collecting grooves, and two ports of the outlet through hole along an axial direction thereof are respectively connected with the second outlet pipeline and the other one of the lower liquid collecting grooves, so as to allow the other stream of the cooling working medium to flow through the second microchannel group, and the upper cold plate and the lower cold plate are connected in parallel.

3. The two-phase double-layer staggered enhanced microchannel heat sink according to claim 1, wherein the first outlet pipeline is connected with the second inlet pipeline, a cooling working medium flowing out of the upper cold plate flows into the lower cold plate, and the upper cold plate and the lower cold plate are connected in series.

4. The two-phase double-layer staggered enhanced microchannel heat sink according to claim 1, wherein:

the porous layer is formed by sintering and solidifying copper powder particles with a particle size of 50 $\mu$m-150 $\mu$m or copper wire mesh with a mesh number of 150 meshes-300 meshes, and a thickness of the porous layer is 0.3 mm to 0.8 mm; or, the porous layer is composed of a plurality of micro fins arranged in an array, and a height of the micro fins along the thickness direction of the cold plate is 0.1 mm-0.14 mm.

5. The two-phase double-layer staggered enhanced microchannel heat sink according to claim 1, wherein a porosity of the porous layer is 40%-60%.

6. The two-phase double-layer staggered enhanced microchannel heat sink according to claim 1, wherein the porosity of the porous layer increases in a direction pointing to a heat source to be cooled.

7. The two-phase double-layer staggered enhanced microchannel heat sink according to claim 1, wherein cross-sections of the first fins and the second fins are rectangular cross-sections.

8. The two-phase double-layer staggered enhanced microchannel heat sink according to claim 1, wherein a projection of the first microchannel group in the thickness direction of the cold plate coincides with a projection of the second microchannel group in the thickness direction of the cold plate.

9. The two-phase double-layer staggered enhanced microchannel heat sink according to claim 1, wherein:

thicknesses of the first fins and the second fins are first thicknesses;

a distance between two adjacent first fins and a distance between two adjacent second fins are first distances;

heights of the first fins and the second fins along the thickness direction of the cold plates are first heights;

wherein the first thicknesses are the same or different, the first distances are the same or different, and the first heights are the same or different.

10. The two-phase double-layer staggered enhanced microchannel heat sink according to claim 1, wherein:

one of side walls of outlet flow channels of the first microchannel group and the second microchannel group is provided with a step, and a height of the step in the thickness direction of the cold plates gradually decreases along a flow direction of the cooling working medium, so that the outlet flow channel gradually expands along the flow direction of the cooling working medium.

11. The two-phase double-layer staggered enhanced microchannel heat sink according to claim 1, wherein the cooling working medium is a working medium with a low boiling point under an atmospheric pressure or a positive pressure, and a boiling point range of the cooling working medium is 20° C.-60° C.

* * * * *